United States Patent
Chen et al.

(10) Patent No.: US 12,531,217 B2
(45) Date of Patent: Jan. 20, 2026

(54) LASER ARRAY SYSTEM FOR IMPROVED LOCAL CD UNIFORMITY

(71) Applicant: TAIWAN SEMICONDUCTOR MANUFACTURING CO., LTD., Hsinchu (TW)

(72) Inventors: Po-Ju Chen, Hsinchu (TW); Cha-Hsin Chao, Taipei (TW); Chih-Teng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 365 days.

(21) Appl. No.: 17/219,236

(22) Filed: Mar. 31, 2021

(65) Prior Publication Data

US 2022/0319818 A1   Oct. 6, 2022

(51) Int. Cl.
| | |
|---|---|
| *H01J 37/32* | (2006.01) |
| *G02B 6/10* | (2006.01) |
| *G02B 19/00* | (2006.01) |
| *G02B 27/10* | (2006.01) |
| *H01J 37/22* | (2006.01) |
| *H01L 21/268* | (2006.01) |
| *H01L 21/3065* | (2006.01) |
| *H01L 21/66* | (2006.01) |
| *H01L 21/67* | (2006.01) |
| *H01L 21/683* | (2006.01) |

(52) U.S. Cl.
CPC .......... *H01J 37/32724* (2013.01); *G02B 6/10* (2013.01); *G02B 19/0009* (2013.01); *G02B 19/0047* (2013.01); *G02B 27/106* (2013.01); *H01J 37/22* (2013.01); *H01L 21/268* (2013.01); *H01L 21/3065* (2013.01); *H01L 21/67069* (2013.01); *H01L 21/67115* (2013.01); *H01L 21/67248* (2013.01); *H01L 21/6833* (2013.01); *H01L 22/20* (2013.01); *H01J 2237/2001* (2013.01); *H01J 2237/3343* (2013.01)

(58) Field of Classification Search
None
See application file for complete search history.

(56) References Cited

U.S. PATENT DOCUMENTS

| | | | |
|---|---|---|---|
| 5,219,798 A | 6/1993 | Kamakura | |
| 6,770,852 B1 * | 8/2004 | Steger | H01L 21/67109 118/724 |
| 7,306,746 B2 | 12/2007 | Chen et al. | |
| 7,560,007 B2 | 7/2009 | Gaff | |
| 7,576,018 B2 | 8/2009 | Funk | |
| 7,674,636 B2 | 3/2010 | Sundararajan et al. | |
| 8,257,546 B2 | 9/2012 | Davis et al. | |

(Continued)

FOREIGN PATENT DOCUMENTS

WO   2008/112673 A2   9/2008

*Primary Examiner* — Dale E Page
*Assistant Examiner* — Derek L Nielsen
(74) *Attorney, Agent, or Firm* — STUDEBAKER BRACKETT PLLC

(57) ABSTRACT

An apparatus includes a processing chamber, a substrate support in the processing chamber, a plasma source coupled to the processing chamber, and a plurality of heating devices arranged on the processing chamber. Each heating device is configured to emit laser beam on a substrate positioned on the substrate support to heat the substrate.

20 Claims, 11 Drawing Sheets

(56) References Cited

U.S. PATENT DOCUMENTS

| | | | |
|---|---|---|---|
| 8,637,794 B2 | 1/2014 | Singh et al. | |
| 9,991,158 B2 | 6/2018 | Hsieh et al. | |
| 10,056,225 B2 | 8/2018 | Gaff | |
| 2009/0111274 A1* | 4/2009 | Noelscher | H01L 21/3065 |
| | | | 156/345.55 |
| 2010/0267173 A1* | 10/2010 | Moffatt | B23K 26/12 |
| | | | 219/121.6 |
| 2013/0277790 A1 | 10/2013 | Hung et al. | |
| 2015/0192856 A1* | 7/2015 | Onvlee | G03F 7/70875 |
| | | | 355/30 |
| 2017/0278761 A1* | 9/2017 | deVilliers | H01L 21/67103 |
| 2019/0127851 A1* | 5/2019 | Lau | C23C 16/46 |
| 2022/0082445 A1* | 3/2022 | Cong | G01J 5/0846 |

\* cited by examiner

LASER ARRAY SYSTEM FOR IMPROVED LOCAL CD UNIFORMITY

BACKGROUND

In semiconductor device manufacturing, various types of plasma processes are used to deposit layers of conductive and dielectric material on semiconductor substrates, and also to blanket etch and selectively etch materials from the substrate. During these processes, the substrate is affixed to a substrate chuck in a process chamber and a plasma generated adjacent the substrate surface. In plasma etching systems, the uniformity of process results across the substrate are affected by a variety of factor including spatial variations in plasma density, spatial variations in process chemistry, and spatial variations of the substrate temperature.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
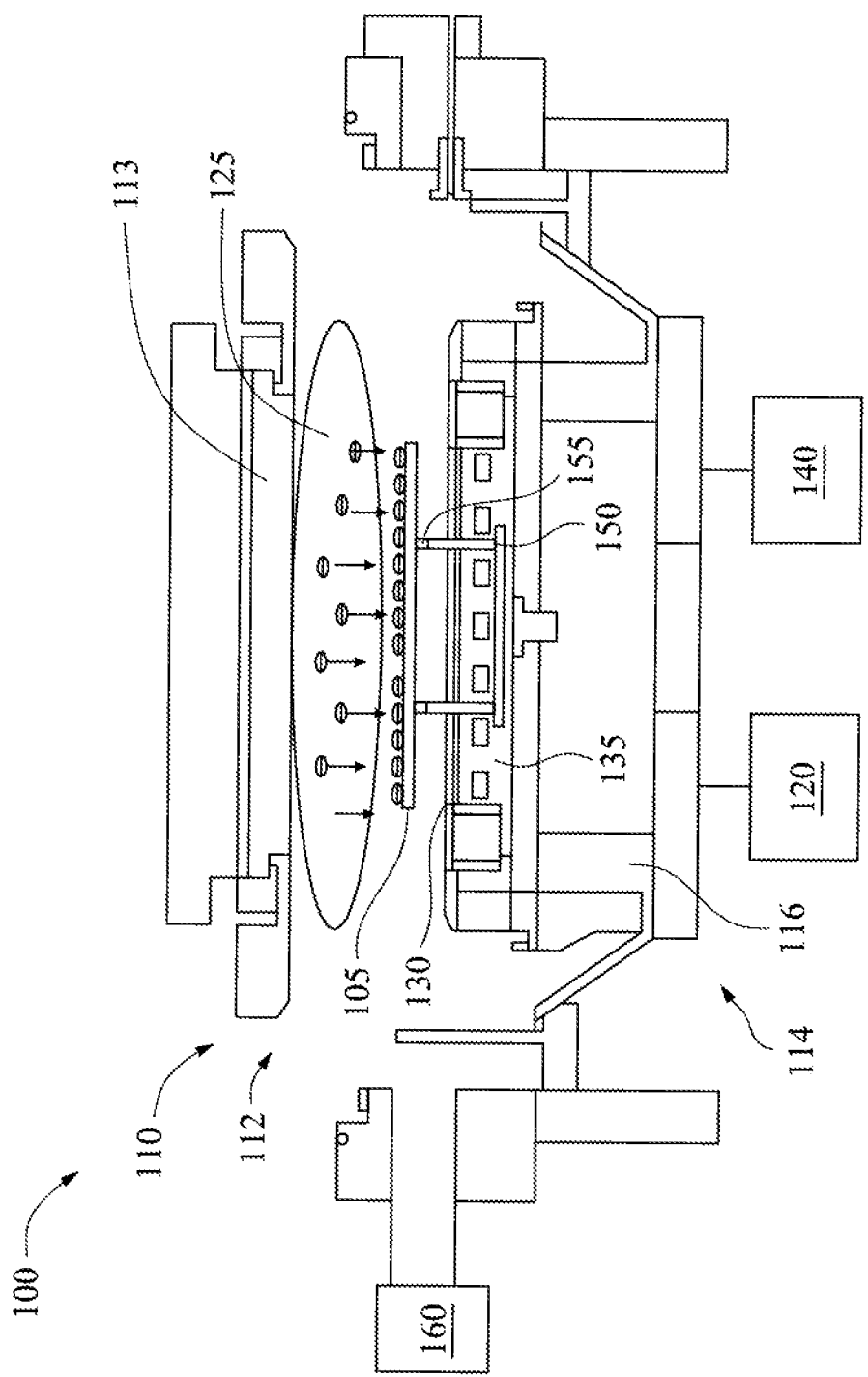
FIG. 1 is a schematic view of an etching apparatus according to an embodiment of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Embodiments disclosed relate to the control of process uniformity across a substrate, including, for example, process uniformity during an etching process performed on a substrate. More specifically, embodiments of the disclosure are directed to the control of process uniformity across a substrate by controlling the substrate temperature. The apparatus and the methods described in various embodiments as disclosed herein improve substrate temperature control in a semiconductor processing apparatus to achieve target critical dimension (CD) uniformity on the substrate.

In semiconductor manufacturing, the complexity of devices formed on semiconductor substrates continues to increase at a rapid pace, while the size of features, such as transistor gates, continues to decrease. As a result, manufacturing processes require increasingly sophisticated unit process and process integration schemes, as well as process and hardware control strategies to ensure the uniform fabrication of devices across the substrate.

During a dry plasma etching process, plasma and the chemistry formed in the presence of plasma are utilized to remove or etch material along fine lines or within vias or contacts patterned on a substrate. The plasma etch process generally involves positioning a semiconductor substrate with an overlying patterned, protective layer, for example a photoresist layer, in a processing chamber. Once the substrate is positioned within the chamber, plasma is formed and selected surfaces of the substrate are etched by the plasma. The process is adjusted to achieve appropriate conditions, including an appropriate concentration of desirable reactant and ion populations to etch various features (e.g., trenches, vias, contacts, etc.) in the selected regions of the substrate. Such substrate materials where etching is required include silicon dioxide (Sift), low-k dielectric materials, poly-silicon, silicon nitride and/or metallic materials.

In these plasma etching systems, the uniformity of process results across the substrate is affected by spatial variations in plasma density within the process space above the substrate, spatial variations in process chemistry (i.e., spatial distribution of chemical species), and spatial variations of the substrate temperature. In addition, the uniformity of process results within one chip area is affected by dimension and/or density of patterns.

The substrate temperature profile in a plasma processing apparatus is affected by many factors, such as the plasma density profile, the RF power profile and the detailed structure of the various heating and cooling elements in the electrostatic chuck. Hence, the substrate temperature profile is often not uniform and challenging to control. This deficiency translates to non-uniformity in the processing rate across the whole substrate and non-uniformity in the critical dimension of the device dies on the substrate.

Because the etch process is affected by the substrate temperature, the distribution of substrate temperature can directly affects the spatial distribution of process results. Even a small variation of temperature may affect CD (critical dimension) to an unacceptable degree, especially as CD approaches sub-20 nm in semiconductor fabrication processes. Moreover, the spatial distribution of substrate temperature, if controlled, may be utilized to compensate for other process or system non-uniformities. One element that affects substrate temperature is the thermal contact between the substrate and the substrate holder. For instance, when a substrate is clamped to the substrate holder, a heat transfer gas, such as helium, is introduced to the micro-space between the backside of the substrate and the topside of the substrate holder in order to improve the thermal conduction between the substrate and substrate holder. With the exception of a small leakage of heat transfer gas at the peripheral edge of the substrate, the net flow of heat transfer gas to the backside of the substrate is substantially zero.

Existing substrate holders utilize a multi-zone backside gas supply system to adjust the distribution of heat transfer gas in order to affect a variation in substrate temperature. However, these systems can facilitate temperature control over two or three large "zones" of the substrate and do not permit a more selective or "finer" control of the substrate temperature. It would be advantageous and desirable to independently control more discrete portions of the substrate to enable a plasma etching system to actively create and maintain the target spatial and temporal temperature profile, and to compensate for adverse factors that affect CD uniformity.

FIG. 1 is a schematic view of an etching apparatus 100, according to an embodiment of the disclosure. As shown in FIG. 1, the etching apparatus 100 includes a process chamber 110, and a source of radio frequency (RF) power 120 configured to provide radio frequency power in the process chamber 110. The etching apparatus 100 also includes an electrostatic chuck 130 within the process chamber 110, and the electrostatic chuck 130 is configured to receive a substrate 105. In accordance with various embodiments, the substrate 105 includes a wafer, silicon substrate, or any other wafer or substrate. The etching apparatus 100 also includes a chuck electrode 135, and a source of direct current (DC) power 140 connected to the chuck electrode 135. The source of DC power 140 is configured to provide power to the chuck electrode 135.

In some embodiments, the etching apparatus 100 is a plasma etching apparatus. In some embodiments, the etching apparatus 100 is any plasma etching or dry etching tool that produces a plasma from a process gas, e.g., oxygen, chlorine-bearing gas, or fluorine-bearing gas, and uses a radio frequency electric field. In some embodiments, the etching apparatus 100 is an ion-beam etcher, reactive ion etcher, or the like. In other embodiments, instead of an etching apparatus, a plasma deposition apparatus is used. It should be noted that principles of the embodiments disclosed herein are not specific to any particular type of semiconductor processing apparatus and the principles according to embodiments of the disclosure are equally applicable to any semiconductor processing apparatus where temperature control of the substrate being processed is desired.

In some embodiments, the substrate 105 is a semiconductor substrate. In some embodiments, the substrate 105 includes a single crystalline semiconductor layer on at least its surface. In some embodiments, the substrate 105 includes a single crystalline semiconductor material such as, but not limited to Si, Ge, SiGe, GaAs, InSb, GaP, GaSb, InAlAs, InGaAs, GaSbP, GaAsSb, and InP. In some embodiments, the substrate 105 is made of Si. In some embodiments, the substrate 105 is a silicon substrate. In some embodiments, the substrate 105 is a semiconductor-on-insulator substrate fabricated using separation by implantation of oxygen (SIMOX), substrate bonding, and/or other suitable methods, such as a silicon-on-insulator (SOI) substrate, a silicon germanium-on-insulator (SGOI) substrate, or a germanium-on-insulator (GOI) substrate. In some embodiments, the substrate 105 is a Si substrate having a mirror polished surface on one side or both sides.

In some embodiments, the process chamber 110 includes an upper portion 112 and a lower portion 114, which are made of a conductive material, such as aluminum. The upper portion 112 includes an upper electrode 113 in some embodiments. In some embodiments, the lower portion 114 includes an insulating ceramic frame 116 and includes the electrostatic chuck 130 within the insulating ceramic frame 116. For example, the electrostatic chuck 130 is disposed within the insulating ceramic frame 116 within the lower portion 114 of the process chamber 110, as shown in FIG. 1. In some embodiments, the electrostatic chuck 130 includes a conductive sheet, which serves as the chuck electrode 135. As shown in FIG. 1, the chuck electrode 135 is connected to the source of DC power 140. When a DC voltage from the source of DC power 140 is applied to the chuck electrode 135 of the electrostatic chuck 130 having the substrate 105 disposed thereon, a Coulomb force is generated between the substrate 105 and the chuck electrode 135. The Coulomb force attracts and holds the substrate 105 on the electrostatic chuck 130 until the application of the DC voltage from the source of DC power 140 is discontinued.

In some embodiments, in order to improve the heat transfer between the substrate 105 and the electrostatic chuck 130, one or more gases, such as He or Ar, is introduced between the substrate 105 and the electrostatic chuck 130. In some embodiments, the gas dissipates heat generated between the substrate 105 and the electrostatic chuck 130 during the application of the DC voltage. In this instance, the upper surface of the electrostatic chuck 130 is provided with an array of gas ports through which the gas can be introduced to, or removed from, the space between the backside of the substrate 105 and the upper surface of the electrostatic chuck 130. The introduction of gas to the backside of the substrate 105 facilitates an increase in the thermal conduction between the substrate 105 and electrostatic chuck 130, while removal of the gas from the backside of the substrate 105 facilitates a decrease in the thermal conduction between the substrate 105 and electrostatic chuck 130. The gas ports are coupled to a gas supply source that supplies the gas via a system of control valves. In some embodiments, temperature sensors, or devices that can detect or monitor the temperatures of the surface of the substrate 105 are also provided on the electrostatic chuck 130. The devices measure the temperature of the substrate and provide the same to controller 251 (discussed below) so that the laser controller can control laser emitters 202 (discussed below) for heating the substrate 105. In some embodiments, a temperature sensor that configured to monitor the surface temperature of the substrate (e.g., an array of optical temperature sensors) is disposed over the substrate.

As illustrated in FIG. 1, the etching apparatus 100 also includes a pump 160 connected to the process chamber 110. The pump 160 is configured to provide a vacuum and/or maintain a certain gas pressure within the process chamber 110. In some embodiments, the pressure within the process chamber 110 is maintained by the combination of the gas or gases being introduced and a level of pumping performed by the pump 160. In some embodiments, the pressure within the process chamber 110 is maintained solely by pumping with the pump 160.

In some embodiments, the electrostatic chuck 130 of the etching apparatus 100 also includes a plurality of pins 150 disposed in the electrostatic chuck 130. In some embodiments, each of the plurality of pins 150 includes an electrically insulated cap 155 to electrically insulate a sample, e.g., the substrate 105, from a main rod of the pin 150. In some embodiments, the plurality of pins 150 are configured to move up the substrate 105 a distance of about 1 mm to about 10 mm away from the surface of the electrostatic chuck 130, and move down to place the substrate on the electrostatic chuck 130. In some embodiments, the distance of about 1 mm to about 10 mm provides effective cleaning of the electrostatic chuck 130.

In some embodiments, the source of radio frequency power 120 is turned on to apply a plasma 125 for plasma etching operations. In some embodiments, the source of radio frequency power 120 (e.g., 13.56 MHz, 2.45 GHz, etc.) is turned on to create a positively charged surface on a surface of the substrate 105. In some embodiments, the source of radio frequency power 120 is configured to apply the radio frequency pulse of about 20% to about 80%, about 30% to about 70%, or about 30% to about 50% of the power applied during normal etching operations. In some embodiments, operating at a power higher about 80% of the normal etching power results in the electrode chuck being etched. In some embodiments, the power applied during the etching operations ranges from about 200 watts to about 700 watts. The application of the radio frequency power creates the positively charged surface on the surface of the substrate 105. In some embodiments, the application of the radio frequency pulse occurs for a duration of about 10 seconds to about 60 seconds, about 10 seconds to about 50 seconds, about 20 seconds to about 40 seconds, or about 20 seconds to about 30 seconds, inclusive of any duration of time therebetween. However, other time durations are also within the scope of the disclosure.

In some embodiments, the source of DC power 140 is configured to apply to the electrostatic chuck 130 DC voltage (e.g. a negative voltage) of about 10% to about 90% of the power applied during normal etching operations using direct current. In some embodiments, the source of DC power 140 is configured to apply the DC voltage of about 20% to about 80%, about 30% to about 70%, or about 30% to about 50% of the power applied during normal etching operations using direct current. The applied DC voltage ranges from about 2000 volts to about 2500 volts in some embodiments. The application of the DC power creates the positively charged surface on the surface of the substrate 105. In some embodiments, the application of the DC voltage occurs for a duration of about 10 seconds to about 60 seconds, about 10 seconds to about 50 seconds, about 20 seconds to about 40 seconds, or about 20 seconds to about 30 seconds, inclusive of any duration of time therebetween. However, other time durations are also within the scope of the disclosure.

Figure 2:
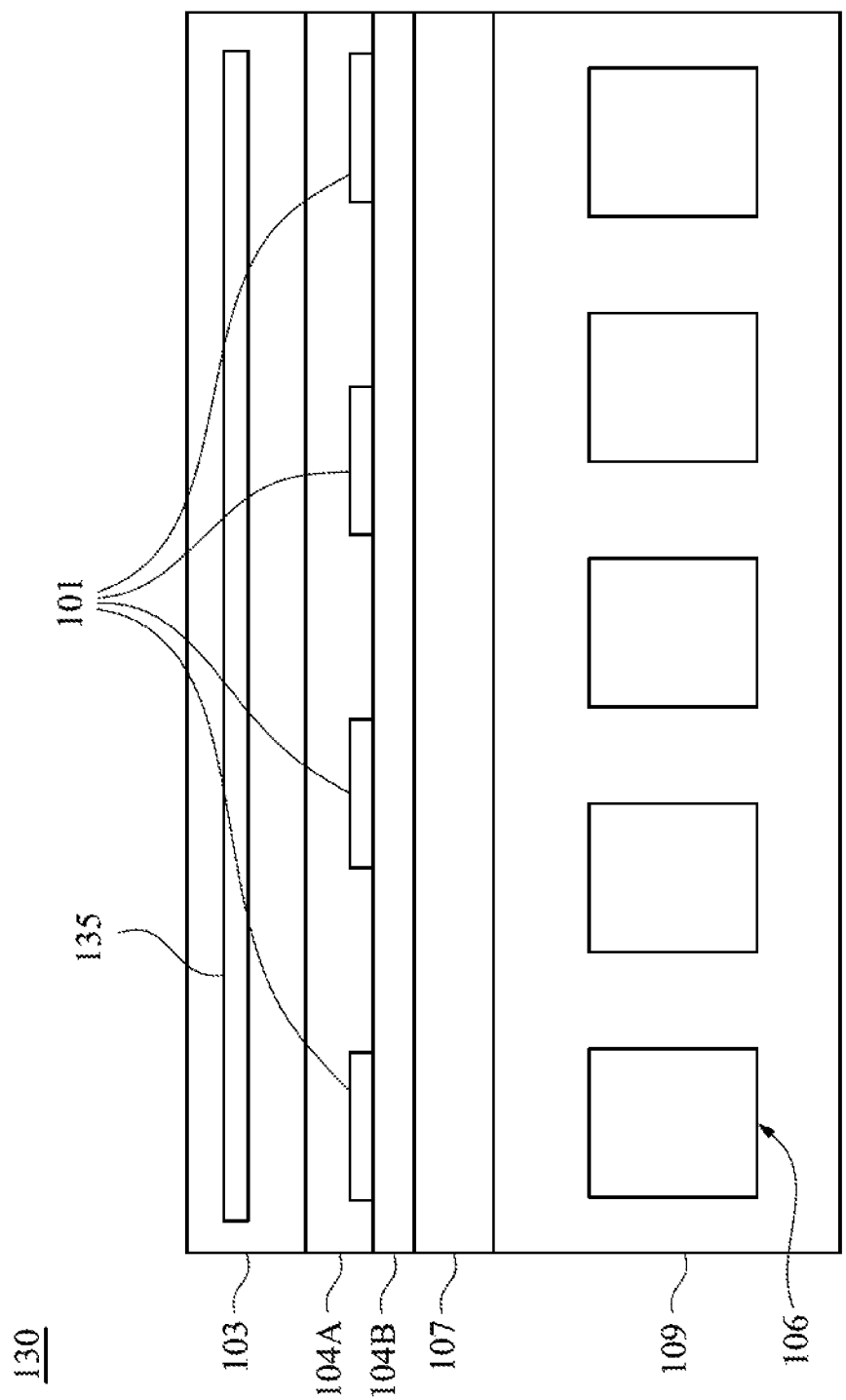
FIG. 2 is a schematic of the cross-sectional view of a substrate support assembly including an electrostatic chuck (ESC) having heater zones.

FIG. 2 is a schematic of the cross-sectional view of a substrate support assembly including an electrostatic chuck (ESC) 130 of FIG. 1. As illustrated, the electrostatic chuck (ESC) 130 includes heater zones 101 incorporated in electrically insulating layers 104A and 104B. The electrically insulating layers 104A and 104B may be a polymer material, an inorganic material, a ceramic such as silicon oxide, alumina, yttria, aluminum nitride or other suitable material. The electrostatic chuck (ESC) 130 further includes a ceramic layer 103 (also referred to as electrostatic clamping layer) in which chuck electrode 135 is embedded to electrostatically clamp substrate 105 to the surface of the ceramic layer 103 when a DC voltage (e.g., direct current (DC) power 140) is applied thereto. The electrostatic chuck (ESC) 130 also includes a thermal barrier layer 107 and a cooling plate 109 containing channels 106 for coolant flow. Typically, the cooling plate 109 is maintained between 0° C. and 30° C. Each of the heater zones 101 can individually control voltages applied to the heater zones. The heater zones 101 can maintain the support surface of the substrate support assembly at temperatures about 0° C. to 80° C. above the cooling plate temperature. By changing the heater power within the plurality of heater zones, the substrate support temperature profile can be changed. The heater zones 101 are arranged in a desired pattern, for example, a rectangular grid, a hexagonal grid, a polar array, concentric rings or any desired pattern. Each heater zone 101 may be of any suitable size and may have one or more heater elements. The heater elements include resistive heaters, such as polyimide heaters, silicone rubber heaters, mica heaters, metal heaters (e.g. W, Ni/Cr alloy, Mo or Ta), ceramic heaters (e.g. WC), semiconductor heaters or carbon heaters.

As mentioned, the substrate temperature profile in a plasma processing apparatus is affected by many factors, including the various heating and/or cooling elements in the electrostatic chuck, and hence the substrate temperature profile is difficult to control. In light of the complex nature of temperature control, it would be advantageous to be able to directly heat discrete portions of the substrate (wafer) and individually control the temperature profile of the different portions of the substrate and thereby create and maintain desired spatial and temporal temperature profile, and to compensate for factors that affect CD uniformity.

Embodiments are directed to an etching apparatus including a laser emitter and a system of lenses that are arranged in the process chamber of the etching apparatus. The laser emitted from the laser emitter is focused by the lenses on the surface of the semiconductor substrate (wafer) to locally heat portions of the substrate and thereby control local surface temperature in a more precise manner.

Figure 3:
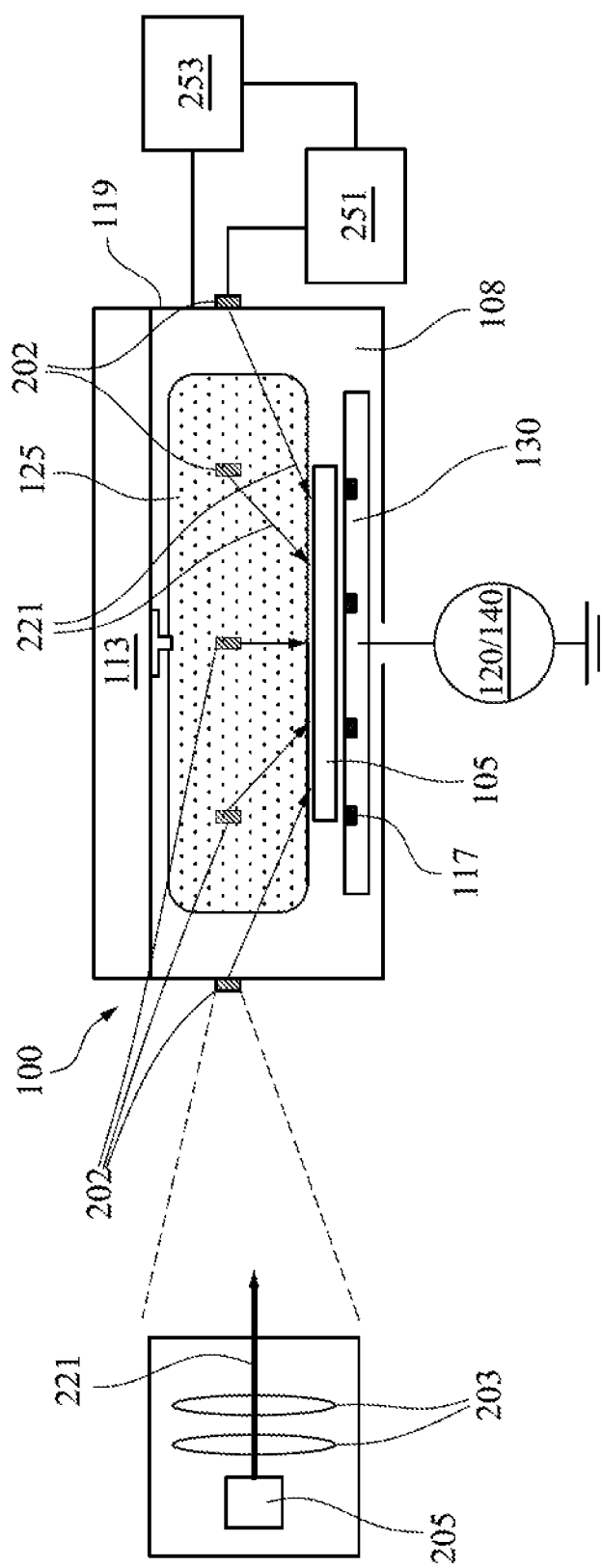
FIG. 3 is a schematic of an etching apparatus including multiple substrate heating devices, according to embodiments of the disclosure.

FIG. 3 is a schematic of the etching apparatus 100 including multiple substrate heating devices, according to embodiments of the disclosure. As illustrated, in some embodiments, the substrate heating devices are laser emitters 202 that are located external to the processing chamber 108, for instance, arranged on the outer surface of the chamber wall 119 of processing chamber 108 of the etching apparatus 100. In some embodiments, the laser beam 221 from the laser emitters 202 is directed to the surface of the substrate positioned in the processing chamber 108 via windows in the chamber wall 119. The windows adopt a suitable material substantially transparent to the laser beams. In some embodiments, the laser emitters 202 are located at the level of the surface of the substrate 105 to around 1-30 cm above the surface. In some embodiments, adjacent laser emitters 202 are separated from each other by a distance of around 0.1 mm to around 10 mm. In some embodiments, the etching apparatus 100 can include from 1 to about 2000 laser emitters 202 depending on the application and design. However, more than 2000 laser emitters 202 are also possible. Although FIG. 3 illustrates the laser emitters 202 located at a same height, embodiments are not limited thereto. In some embodiments, one or more laser emitters 202 can be located at different heights from one or more other laser emitters 202, without departing from the spirit and scope of the disclosure.

As illustrated, a laser emitter 202 includes a laser generator (source) 205 for generating a desired type of laser light and a system (array) of lenses 203 that focus the laser light from the laser generator into one or more laser beams 221 (one shown). In some embodiments, the laser generator 205 includes solid state, gas, excimer, dye, or semiconductor lasers. The wavelength of the emitted laser (or laser beam 221) can be around 10 nm to around 100 In some embodiments, the laser beam has a wavelength in an infrared range. The size of the laser beam 221 incident on the substrate 105 is around 1 μm$^2$ to around 100 mm$^2$. The laser beam 221 can heat local positions on the substrate 105 to control the critical dimension (CD) and depth (e.g., etch depth) in an area around 0.01 mm$^2$ to around 100 mm$^2$ on the surface. Although embodiments disclose a single laser beam 221 being generated from each laser emitter 202, in other embodiments, more than one laser beam can be generated from a laser emitter 202.

The laser emitters 202 are configured to emit a laser beam 221 that can locally increase the surface temperature of the substrate 105 to a desired level. In some embodiments, the laser beam 221 can increase the surface temperature of the substrate 105 up to around 300° C. with an accuracy within 0.1° C., depending on the materials to be heated and processes. If the temperature exceeds about 300° C., it may damage the underlying structure (e.g., unnecessary impurity diffusion). For instance, if the original surface temperature of the substrate 105 is around 40° C., then laser beam 221 can increase the surface temperature up to around 200-280° C. In some embodiments, temperature sensors 117 that can detect the temperatures of the surface of the substrate 105 are also provided on the electrostatic chuck 130, and the measured temperature is fed-back to adjust the power of the laser emitters 202 to obtain desired temperature.

The laser emitters 202 are controlled with a controller 251 that is communicably coupled to the laser emitters 202. The controller 251 can be a general-purpose microprocessor, a microcontroller, a Digital Signal Processor (DSP), an Application Specific Integrated Circuit (ASIC), a Field-Programmable Gate Array (FPGA), a Programmable Logic Device (PLD), a controller, a state machine, gated logic, discrete hardware components, or any other suitable entity that can perform calculations or other manipulations of information. The controller 251 includes or is connected to a storage device that can be a Random Access Memory (RAM), a flash memory, a Read-Only Memory (ROM), a Programmable Read-Only Memory (PROM), an Erasable PROM (EPROM), registers, a hard disk, a removable disk, a CD-ROM, a DVD, or any other suitable storage device, for storing information and instructions to be executed by the controller 251.

In some embodiments, the processing chamber 108 includes instruments 253 for measuring the etch depth profile or the CD of the structures being formed on the substrate 105 in real time (in-situ). In some embodiments, the instruments 253 utilize one or more optical measuring techniques, such as spectroscopy, scatterometry, reflectometry, and the like, to measure the etch depth profile or the CD of the structures. The measurement results are provided to the controller 251 for controlling the laser emitters 202 to adjust the temperature of the substrate 105 to obtain the desired results. For example, the controller 251 controls the laser emitters 202 to increase or decrease the temperature of the substrate 105 depending on the measured etch depth profile or the CD of the structures being formed on the substrate 105. In some embodiments, when the etching amount is too high, the laser intensity is reduced, and when the etching amount is too low, the laser intensity is increased. In other embodiments, when the etching amount is too high, the laser intensity is increased, and when the etching amount is too low, the laser intensity is reduced.

In some embodiments, a single laser emitter 202 is provided and one or more optical fibers are connected thereto. The optical fibers are introduced into the processing chamber 108 to direct the laser beam 221 onto different locations of the substrate 105.

Figure 4:
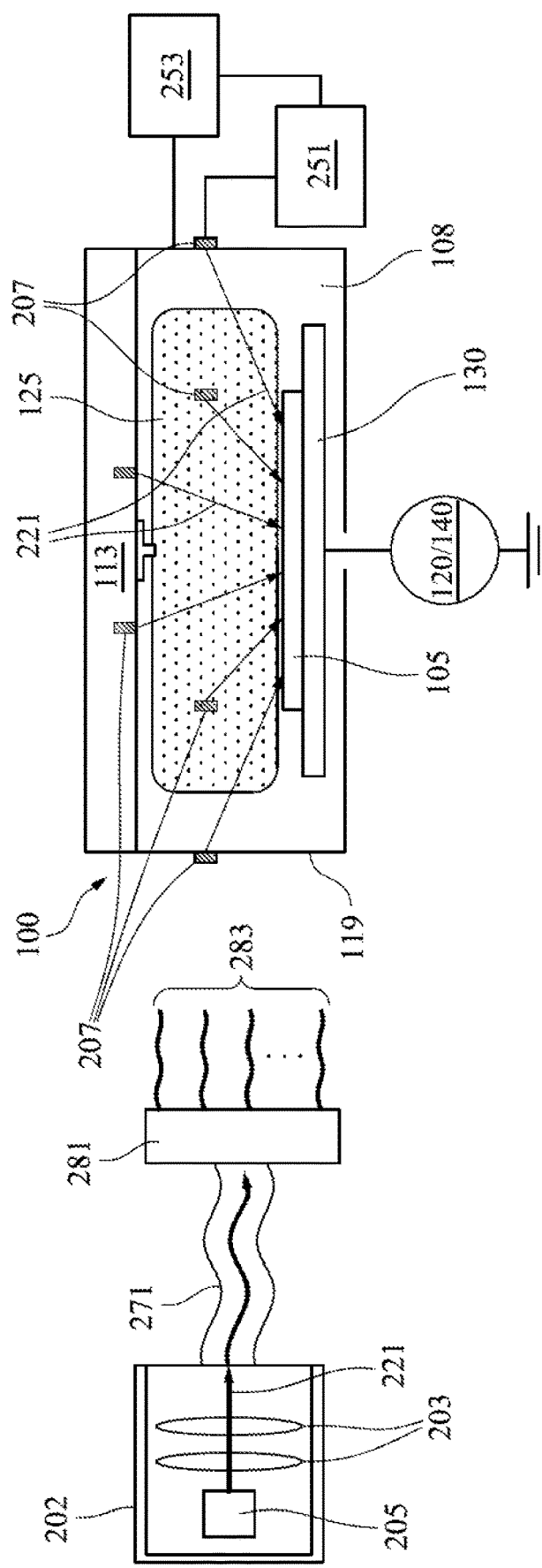
FIG. 4 illustrates the etching apparatus including a single laser emitter coupled to an optical fiber.

FIG. 4 illustrates the etching apparatus 100 including a single laser emitter 202 coupled to an optical fiber 271. Multiple optical fibers 283 can be coupled to the optical fiber 271 using a fiber coupler 281 to provide the laser beam 221 to one or more different locations 207 in the processing chamber 108. For example, the optical fibers 283 are introduced at or adjacent the upper electrode 113, the chamber wall 119, or any other desired location in the processing chamber 108. Thus, different areas of the substrate 105 can be heated simultaneously. In some embodiments, different areas are heated with different laser intensities to ensure a uniform process result. In some embodiments, a feedback control is used.

In some embodiments, the laser beam from the optical fibers 283 is directed into processing chamber 108 and on the surface of the substrate 105 positioned therein via windows in the chamber wall 119. The windows adopt a suitable material substantially transparent to the laser beams. In some embodiments, the windows are provided with shutters that are controlled individually (e.g., using the controller 251) to selectively permit the laser beams from the optical fibers 283 to strike the substrate 105. Thus a single laser emitter 202 can be used to heat different areas of the substrate 105. In some embodiments, the laser emitted from the single layer is scanned over the substrate 105 with or without changing its intensity (power).

In some embodiments, a beam splitter is used to split the laser beam 221 into two (or more) different light beams which are then transported using a plurality of optical fibers 271 to different locations of the etching apparatus 100.

Figure 5B:
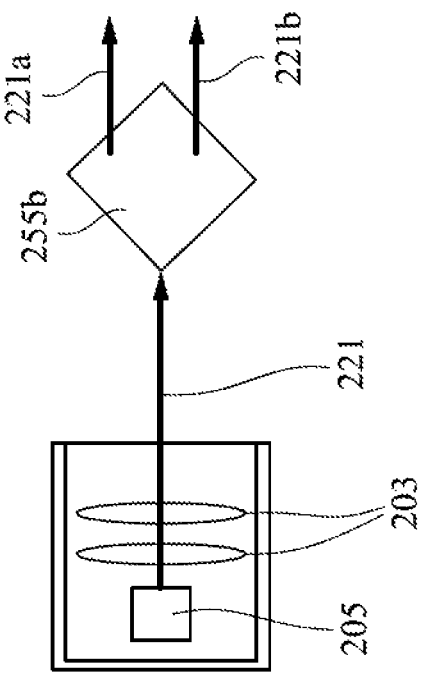
FIGS. 5A and 5B illustrate different types of beam splitters for splitting a laser beams.
Figure 5A:
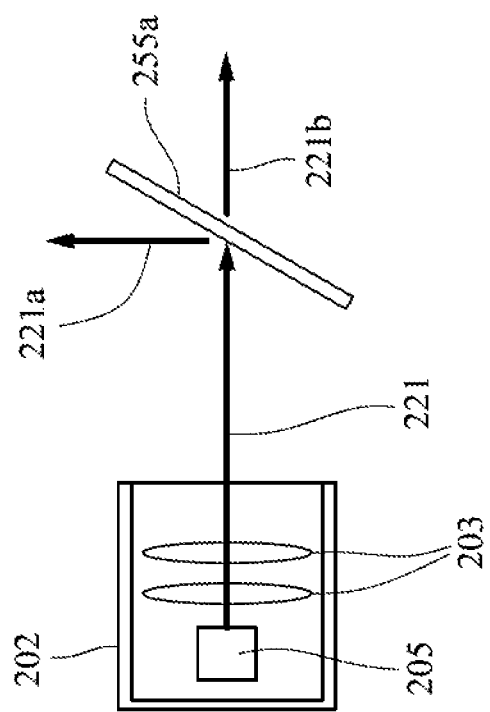

FIGS. 5A and 5B illustrate different beam splitters 255a and 255b for splitting the laser beams 221. As illustrated, in FIG. 5A, the beam splitter 255a is a plate beam splitter (e.g., partially reflecting mirror) that splits the incident laser beam 221 into two transverse laser beams 221a and 221b. Each laser beam 221a and 221b can then be provided to different locations on the substrate 105 using one or more optical fibers. As illustrated, in FIG. 5B, the beam splitter 255b is a cube beam splitter (e.g., made of two triangular glass prisms) that splits the incident laser beam 221 into two generally parallel laser beams 221a and 221b. Each laser beam 221a and 221b can then be provided to different locations on the substrate 105 by one or more optical fibers. Thus, by using a beam splitter, a laser beam 221 from a single laser emitter 202 can be provided to different locations of the etching apparatus 100. As a result, the number of laser emitters 202 required is reduced. In some embodiments, more than one beam splitter (e.g., 2, 3, 4, 8 . . . ) is used in parallel and/or in series to further split the beam. By splitting the beam into multiple beams, it can increase an area to be irradiated the laser beams at the same time. In addition, the different locations on the substrate 105 can be heated simultaneously.

In some embodiments, the beam splitters 255a and 255b are movable dynamically (e.g., before, after, or during processing) using the controller 251 to direct the laser beams 221a and 221b to different portions of the substrate. Thus, a single beam splitter can be used to heat substrates of different sizes. Additionally or alternatively, the laser emitters 202 can be moved dynamically (e.g., before, after, or during processing) to reposition the laser emitters 202 on the processing chamber and thereby heat different portions of the substrates depending on size of substrate, chip size, and/or patterns on chip.

In some embodiments, two or more laser emitters 202 can be used to heat different portions of the substrate 105 independently. In this case, each laser emitter 202 is provided with a corresponding beam splitter and optical fibers transmit the split laser beams to different locations on the substrate. The controller 251 is programmed to control the laser emitters 202 independent of each other to independently heat the different portions of the substrate 105.

Figure 6:
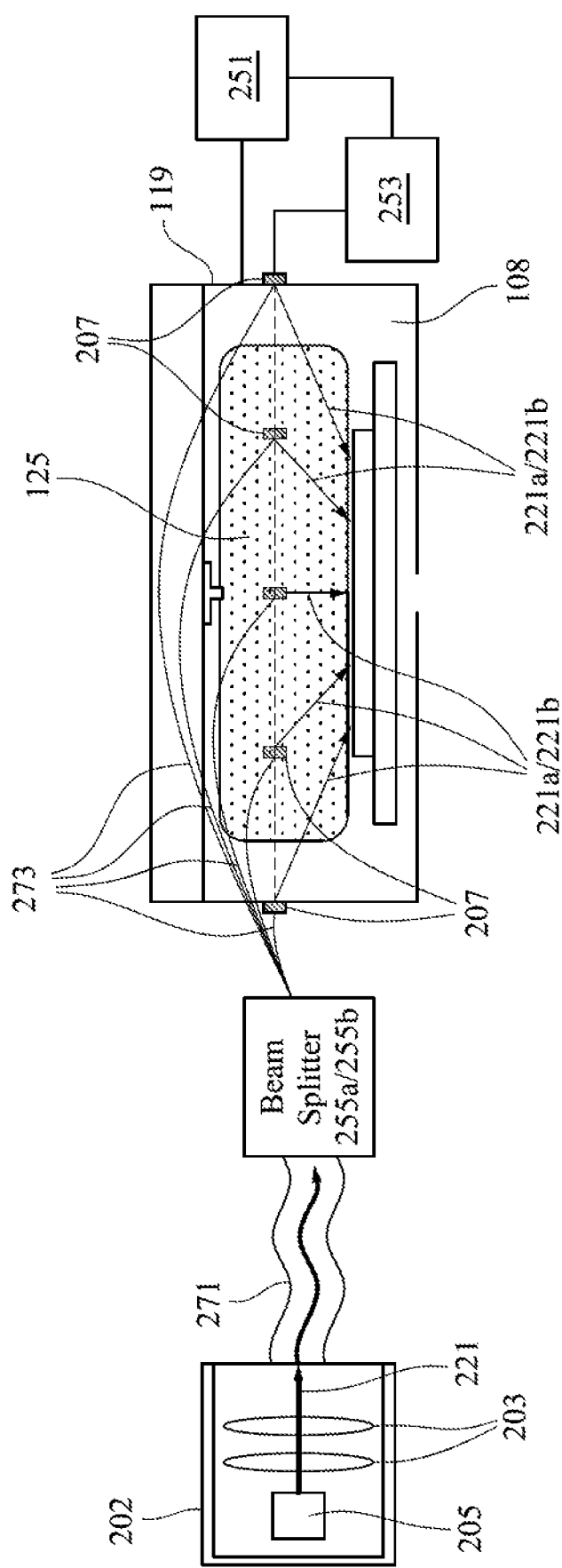
FIG. 6 illustrates the beam splitter of FIGS. 5A and 5B coupled to the laser emitter via optical fiber.

FIG. 6 illustrates the beam splitter 255a or 255b coupled to the laser emitter 202 via optical fiber 271. The laser beams 221a and/or 221b are then transmitted to different locations 207 in the processing chamber 108 via optical fibers 273.

Figure 7:
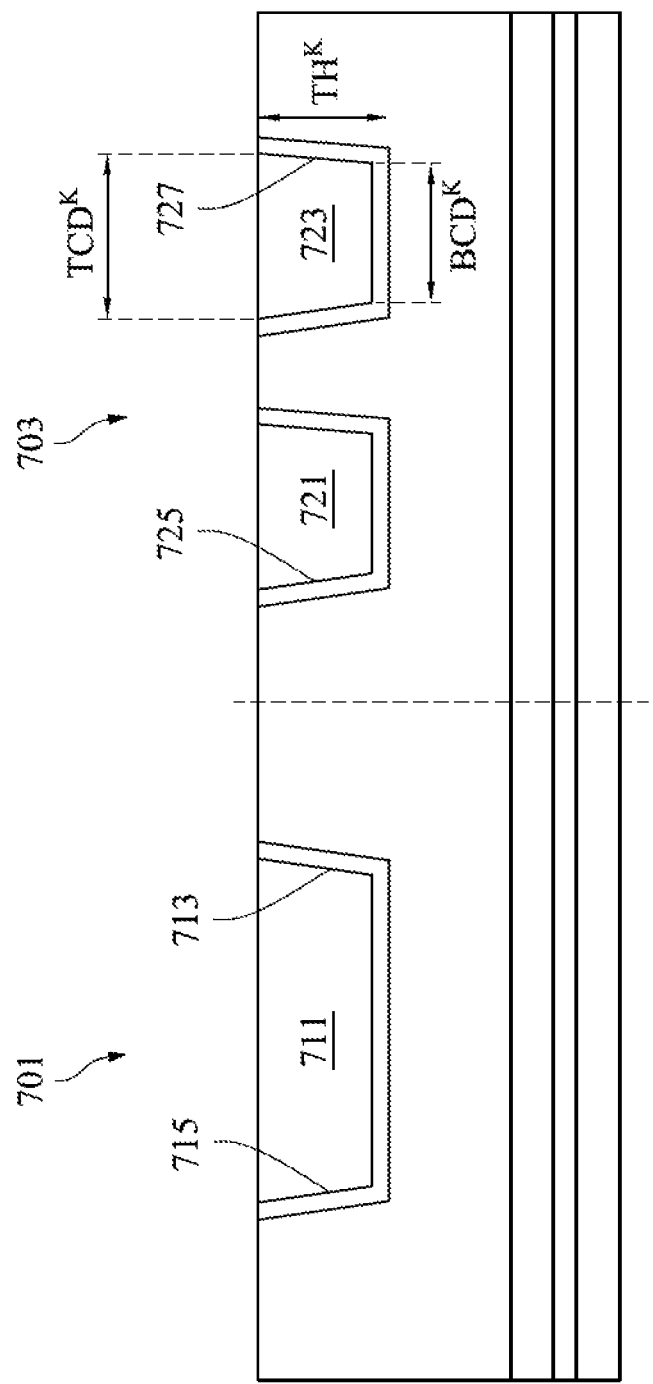
FIG. 7 illustrates a trench pattern that is obtained in an etching operation that uses the substrate surface temperature techniques according to embodiments of the disclosure.

Controlling the temperature of the substrate, according to the embodiments disclosed herein, improves the process uniformity across the substrate and results in an improved target critical dimension (CD) uniformity. FIG. 7 illustrates a trench pattern that is obtained in an etching operation that uses the substrate surface temperature techniques according to embodiments of the disclosure. Generally, a semiconductor chip includes a plurality of areas having different pattern density. Depending on the density of patterns, the etching results may vary due to, for example micro-loading effect. Illustrated are two adjacent areas 701 and 703 on a semiconductor substrate (e.g., substrate 105). The area 701 includes an electrode 711 formed in a trench 713 and area 703 includes electrodes 721 and 723 formed in trenches 725 and 727, respectively. Using the temperature control methods, according to the embodiments disclosed herein, the trenches 713, 725, and 727 are obtained having a trench depth ratio $TH^K/TH^K$ of the depths $TH^K$ of the trenches 713 and 725, or 713 and 727 of around 0.8 to around 1.2, and a ratio of the top CD $TCD^K$ and bottom CD $BCD^K$ between around 0.8 and around 1.2. In addition, the trenches 713, 725, and 727 have a trench line width ratio $TCD^K/TCD^K$ and $TCD^K/TCD^K$ of around 0.8 to around 1.2. The angle of the sidewalls 715 of the trenches 713, 725, and 727 with the wafer surface is around 70° (+/−1°) to around 90° (+/−1°). In some embodiments, a higher temperature can make the trench deeper. A pattern density of trench patterns thus obtained is around 20% to 80%. Thus, it is understood that the trenches can be formed with relatively high precision and relatively high pattern density.

In some embodiments, an etching depth of trench/hole patterns depends on a pattern density. In some embodiments, when the pattern density decreases (more fine patterns exist per area, e.g., pattern density is equal to or more than 40%), the etching depth decreases. In such a case, the high pattern density areas are irradiated by the laser beams to locally heat the area to increase the etching rate. In some embodiments, a low pattern density means a higher opening area to be etched. In some embodiments, the controller analyzes a layout of a semiconductor chip, determines pattern density areas, and determining laser beam intensities to be applied to the substrate. Similarly, in some embodiments, the controller analyzes a layout of a semiconductor chip, determines fine pattern areas (e.g., pattern size is equal to or less than about 50 nm, 100 nm, 500 nm or 1000 nm) and coarse pattern areas (pattern size is greater than the fine patterns), and determining laser beam intensities to be applied to the substrate. In some embodiments, pattern sizes are classified into three or more ranges.

Figure 8:
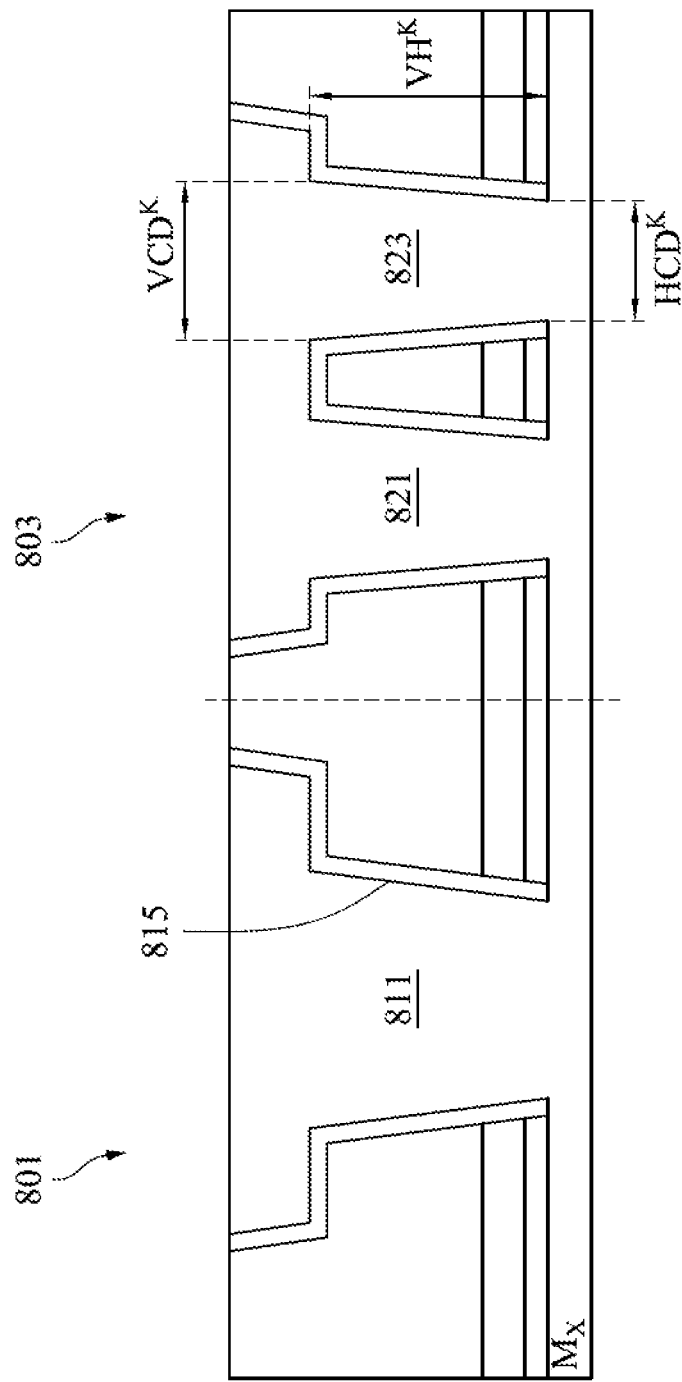
FIG. 8 illustrates a via pattern that is obtained in an etching operation using the substrate surface temperature techniques according to embodiments of the disclosure.

FIG. 8 illustrates a via pattern that is obtained in an etching operation using the substrate surface temperature techniques according to embodiments of the disclosure. Illustrated are two adjacent areas 801 and 803 on a semiconductor substrate (e.g., substrate 105). The area 701 includes a via 811 and area 803 includes vias 821 and 823. Using the temperature control methods, according to the embodiments disclosed herein, CD ratio $VCD^K/HCD^K$ of the width $VCD^K$ at the top of the via and width $HCD^K$ at the bottom of the via the vias 811, 821, and 823 is obtained around 0.8 to around 1.2. The angle of the sidewalls 815 of the vias 811, 821, and 823 with reference to the wafer surface is around 40° (+/−1°) to around 80° (+/−1°). $M_x$ is an under lying metal layer. $VH^K$ is a height of a via. A pattern density of via patterns thus obtained, using the substrate surface temperature techniques according to embodiments of the disclosure, is around 0.01% to around 20%. Thus, it is understood that the vias can be formed with relatively high precision and improved pattern density.

Figure 9B:
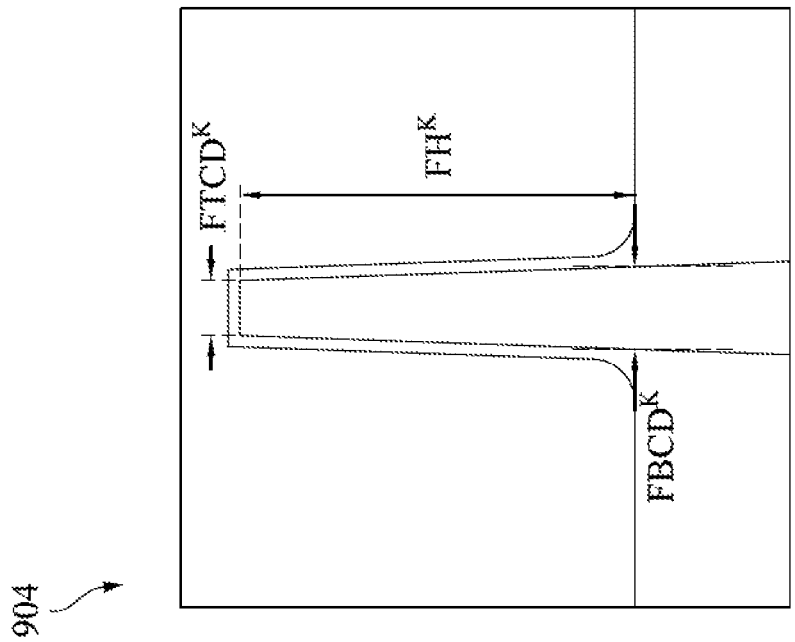
FIG. 9B is a schematic cross-sectional view of a fin in FIG. 9A.
Figure 9A:
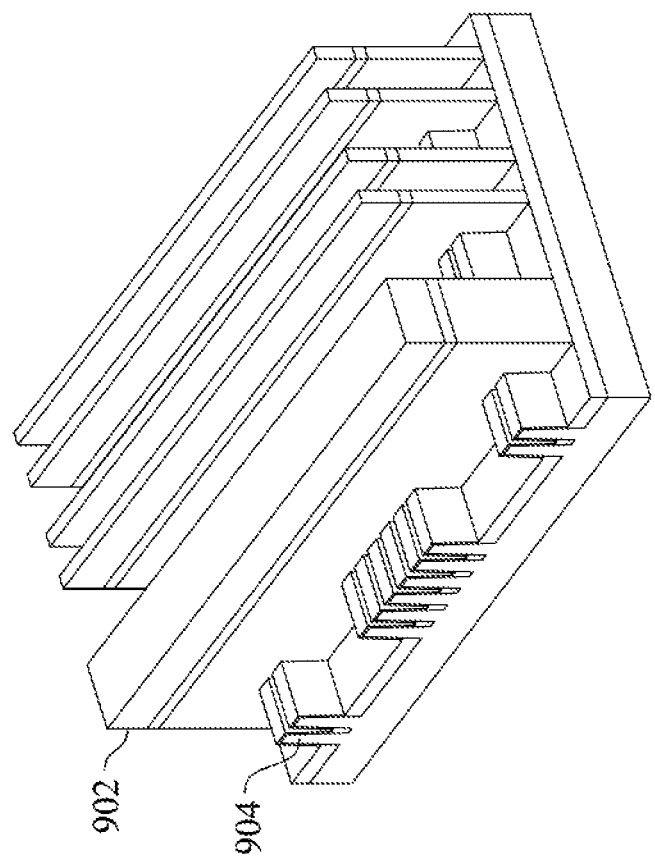
FIG. 9A illustrates a fin pattern of a finFET device that is obtained in an etching operation using the substrate surface temperature techniques according to embodiments of the disclosure.

FIG. 9A illustrates a fin pattern of a finFET device that is obtained in an etching operation using the substrate surface temperature techniques according to embodiments of the disclosure. FIG. 9B is a schematic cross-sectional view of a fin 904 in FIG. 9A. For the sake of brevity, the source and drain regions are omitted from FIG. 9A. As illustrated, in FIG. 9A, a gate structure 902 is formed over the fins 904 that connect the source and drain regions of the finFET. The gate structure 902 is also referred to as a poly (PO) pattern. Referring to FIG. 9B, using the temperature control methods, according to the embodiments disclosed herein, the ratio of the heights $FH^K$ of the adjacent fins is obtained around 0.8 to around 1.2. The top and bottom CD ratio $FTCD^K/FBCD^K$ for adjacent fins 904 is around 0.8 to around 1.2. Herein, the top CD is represented as $FTCD^K$ and the bottom CD is represented as $FBCD^K$. A fin footing angle for the adjacent fins is around 70° (+/−1°) to around 90° (+/−1°). A pattern density of fin patterns obtained, using the substrate surface temperature techniques according to embodiments of the disclosure, is around 1% to 50%. Thus, relatively high precision fins having relatively higher pattern density can be obtained.

Figure 9C:
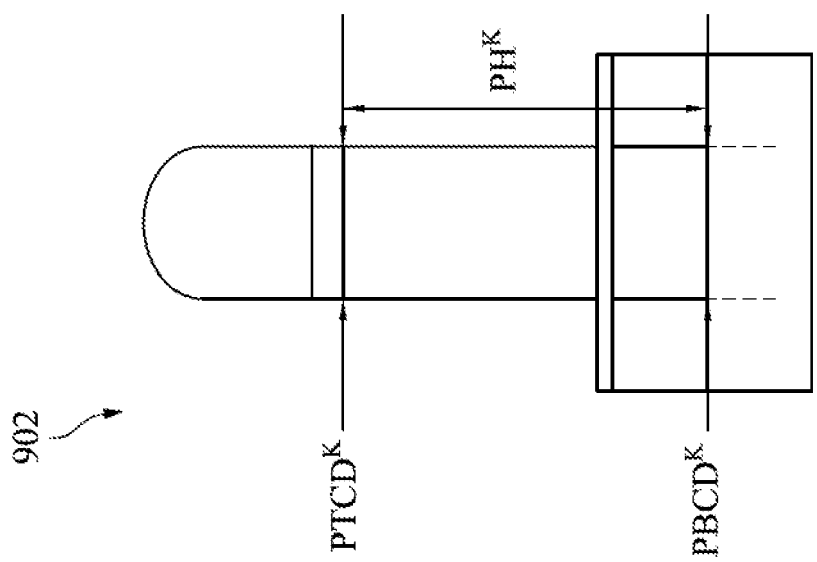
FIG. 9C is a schematic cross-sectional view of a gate structure in FIG. 9A.

FIG. 9C is a schematic cross-sectional view of a gate structure 902 in FIG. 9A. In FIG. 9C, using the temperature control methods, according to the embodiments disclosed herein, the ratio of the heights $PH^K$ of the adjacent gate structures 902 is obtained around 0.8 to around 1.2. The top and bottom CD ratio $PTCD^K/PBCD^K$ for adjacent gate structures 902 is around 0.8 to around 1.2. Herein, the top CD is represented as $PTCD^K$ and the bottom CD is represented as $PBCD^K$. A gate structure footing angle for the adjacent gate structures is around 70° (+/−1°) to around 90° (+/−1°). A pattern density of gate structure patterns obtained, using the substrate surface temperature techniques according to embodiments of the disclosure, is around 20% to 80%.

Thus, relatively high precision gate structures having relatively higher pattern density can be obtained.

Figure 10:
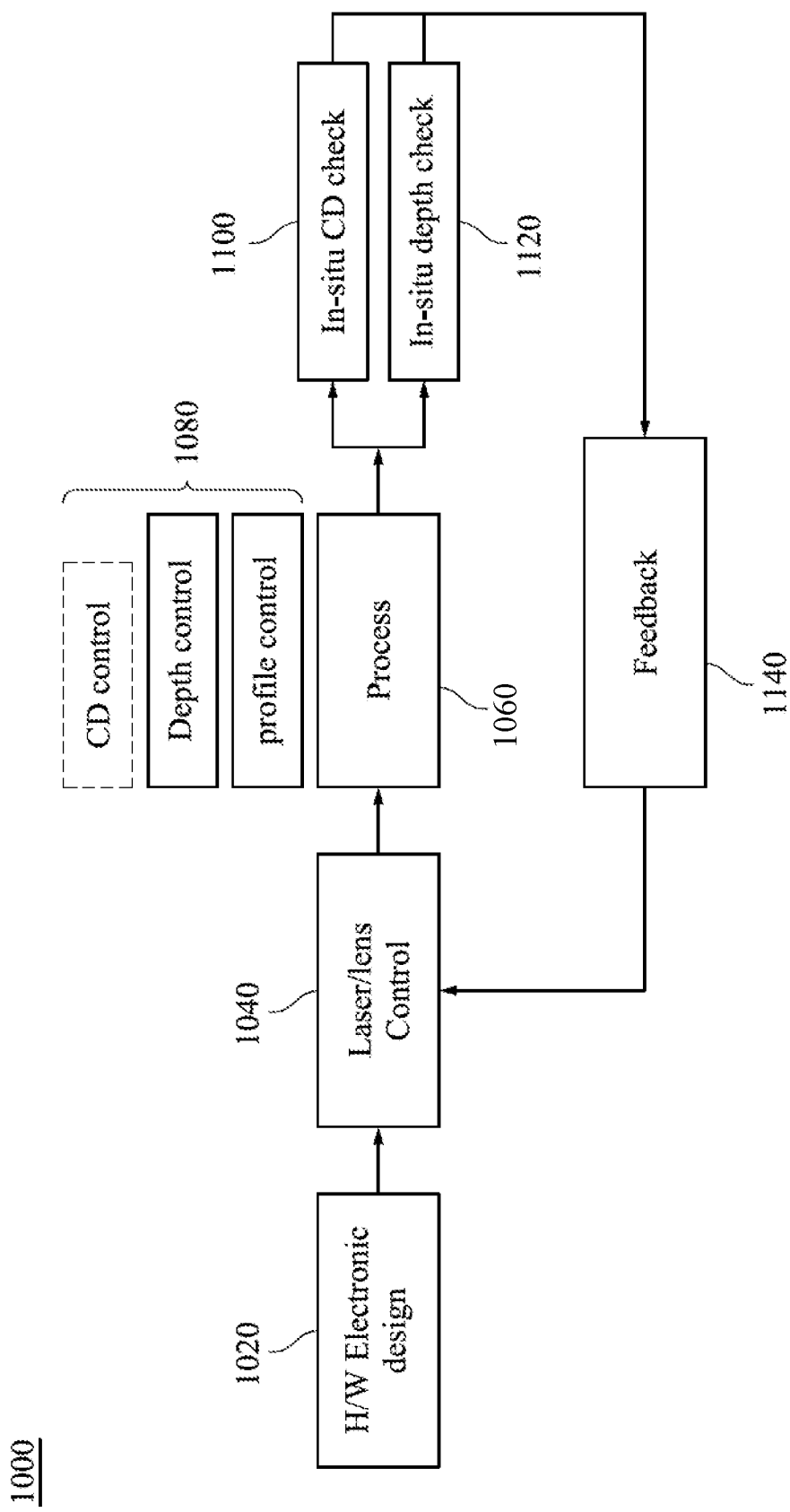
FIG. 10 illustrates a process flow incorporating the principles of the embodiments of the disclosure.

FIG. 10 illustrates a process flow 1000 incorporating the principles of the embodiments of the disclosure. Starting at process block 1020, a design of an electronic circuit (e.g., integrated circuit) is provided to a process block 1040. The process block 1040 includes a laser and lens controller for controlling the laser emitters 202 to heat one or more desired portions of the substrate 105. The laser emitters 202 are controlled to emit lasers to heat the one or more desired portions of the substrate based on the electronic circuit design requirements. In block 1060, desired processing is performed on the substrate 105 depending on the circuit design. For example, the processing can include plasma etching. The heating control as disclosed herein is performed prior to, during (simultaneously) and/or after an etching operation of etching a target layer formed over a substrate. Among other steps, the processing also includes heating the one or more desired portions of the substrate 105 using the laser emitters 202. The processing also includes one or more process control blocks 1080. In some embodiments, the process control includes CD control, depth control, and profile control of the circuit features (e.g., vias, trenches, fins, gate structures) in electronic circuit design. In process blocks 1100 and 1120, in-situ CD measurement and in-situ depth measurement are performed, respectively, and the results are provided to a feedback process 1140 to ensure whether the CD and the depth are within a desired threshold. In some embodiments, the feedback process 1140 includes the controller 251. Depending on the values of the CD and/or depth, controller 251 controls the laser emitters 202 to increase or decrease or maintain the heating of one or more portions of the substrate 105.

Embodiments of the present disclosure are directed to controlling process uniformity across a substrate by controlling the temperature of the substrate and thereby achieve target critical dimension (CD) uniformity on the substrate.

It will be understood that not all advantages have been necessarily discussed herein, no particular advantage is required for all embodiments or examples, and other embodiments or examples may offer different advantages.

According to one aspect of the present disclosure, an apparatus includes a processing chamber, a substrate support in the processing chamber, a plasma source coupled to the processing chamber, and a plurality of heating devices arranged on the processing chamber. In some embodiments, each heating device is configured to emit laser beam on a substrate positioned on the substrate support to heat the substrate. In some embodiments, the apparatus also includes a plurality of sensors for monitoring a temperature of one or more areas of the substrate, and a controller operable to control the plurality of heating devices in response to the monitoring by the plurality of sensors so as to individually control the temperature of the one or more areas of the substrate. In some embodiments, the plurality of heating devices are arranged on the wall of the processing chamber. In some embodiments, the plurality of heating devices are arranged at a same level as a surface of the substrate. In some embodiments, each heating device is arranged vertically separated by a same distance from a surface of the substrate. In some embodiments, the plurality of heating devices are arranged at different vertically distances from a surface of the substrate. In some embodiments, a wavelength of laser beam emitted by the heating devices is between 10 nm to 100 μm. In some embodiments, the plurality of heating devices are configured to emit laser beam that increase a temperature of an area of the substrate to up to 200° C. In some embodiments, each heating device includes a laser generator that generates laser light and one or more lenses that focus the laser light from the laser generator into the laser beam.

According to another aspect of the present disclosure, an apparatus includes a processing chamber, a substrate support in the processing chamber, a plasma source coupled to the processing chamber, and a heating device including an optical fiber coupled thereto. The heating device is configured to transmit a laser beam on a substrate positioned on the substrate support to heat the substrate via the optical fiber. In some embodiments, the apparatus further includes a beam splitter coupled to the optical fiber and configured to split the laser beam into two or more different laser beams, each of the split laser beams being incident on different areas of the substrate. In some embodiments, each of the split laser beams is transmitted to the corresponding area of the substrate via a corresponding optical fiber. In some embodiments, the split laser beams heat different areas of the substrate to a temperature that is different from other areas of the substrate. In some embodiments, the heating device includes a laser generator that generates laser light and one or more lenses that focus the laser light from the laser generator into the laser beam.

According to an aspect of the present disclosure, a method includes supporting a substrate on a substrate support in a processing chamber, heating one or more areas on a surface of the substrate using laser beams emitted from a plurality of heating devices arranged vertically above the substrate, monitoring a process condition at the areas across the substrate, and in the response to the monitoring of the process condition, controlling the heating devices to individually control the process condition of different areas of the substrate. In some embodiments, the processing chamber is of a plasma etching apparatus, and the method further includes etching a target layer disposed over the substrate and individually controlling the process condition of the different areas of the substrate to control critical dimensions of circuits being fabricated on the substrate using plasma etching. In some embodiments, the process condition is one of a temperature, an emission intensity from the plasma, a line width (CD), a film thickness, and/or an etching rate/amount, and etc. In some embodiments, different areas of the substrate are simultaneously heated to different temperatures using the plurality of heating devices. In some embodiments, the heating the one or more areas comprises heating the one or more areas to up to 200° C. In some embodiments, the controlling the heating devices comprises adjusting intensity of laser beams. In some embodiments, wavelengths of laser beams emitted by the heating devices are between 10 nm to 100 μm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
a processing chamber configured to contain an etching process;
a substrate support in the processing chamber, wherein the substrate support comprises an electrostatic chuck configured to receive a substrate;
a plurality of temperature sensors provided on the electrostatic chuck, wherein the plurality of temperature sensors are configured to monitor temperatures of two or more areas of the substrate received by the electrostatic chuck;
a plasma source coupled to the processing chamber;
a plurality of heating devices, each of the plurality of heating devices being configured to emit a laser beam;
a beam splitter configured to split the laser beam into two or more laser beams and dynamically move and direct the two or more laser beams;
an instrument configured to measure a critical dimension of a structure while the structure is being formed on the substrate during the etching process conducted in the processing chamber; and
a controller configured to conduct operations comprising:
control movement of the beam splitter to direct the two or more laser beams to different portions of the substrate during the etching process, and
control heating supplied to the substrate by the two or more laser beams during the etching process in response to at least the measured critical dimension fed back to the controller from the instrument during the etching process, and the temperatures of two or more areas of the substrate monitored by the plurality of temperature sensors during the etching process.

2. The apparatus of claim 1, wherein a wavelength of the laser beam emitted by each of the plurality of heating devices is between 10 nm to 100 μm.

3. The apparatus of claim 1, wherein the beam splitter is configured to direct the two or more laser beams to increase the temperatures of the two or more areas of the substrate to up to 200° C.

4. The apparatus of claim 1, wherein each of the plurality of heating devices includes a laser generator that generates laser light and one or more lenses that focus the laser light from the laser generator into the laser beam.

5. The apparatus of claim 1, wherein the instrument is configured to optically measure the critical dimension of the structure being formed on the substrate during the etching process.

6. The apparatus of claim 1, wherein the beam splitter comprises a plate configured to split the laser beam into the two or more laser beams.

7. The apparatus of claim 1, wherein the beam splitter comprises a cube including two glass prisms configured to split the laser beam into the two or more laser beams.

8. An apparatus, comprising:
a processing chamber configured to contain an etching process;
a substrate support in the processing chamber, wherein the substrate support comprises an electrostatic chuck configured to receive a substrate;
a plurality of temperature sensors provided on the electrostatic chuck, wherein the plurality of temperature sensors are configured to monitor temperatures of two or more areas of the substrate received by the electrostatic chuck during the etching process;
a plasma source coupled to the processing chamber;
a heating device configured to emit a laser beam;
a beam splitter configured to split the laser beam into two or more laser beams and dynamically move and direct the two or more laser beams;
an instrument configured to measure a critical dimension of a structure while the structure is being formed on the substrate during the etching process; and
a controller, configured to conduct operations comprising:
control movement of the beam splitter and direct the two or more laser beams to different portions of the substrate during the etching process, and
control heating supplied to the substrate by the two or more laser beams during the etching process in response to at least the measured critical dimension fed back to the controller from the instrument during the etching process, and the temperatures of the two or more areas of the substrate monitored by the plurality of temperature sensors during the etching process.

9. The apparatus of claim 8, wherein the two or more laser beams are configured to heat different areas of the substrate to a temperature that is different from other areas of the substrate.

10. The apparatus of claim 8, wherein the heating device includes a laser generator that generates laser light and one or more lenses that focus the laser light from the laser generator into the laser beam.

11. The apparatus of claim 8, wherein the beam splitter comprises a plate configured to split the laser beam into the two or more laser beams.

12. The apparatus of claim 8, wherein the beam splitter comprises a cube including two glass prisms configured to split the laser beam into the two or more laser beams.

13. A method for manufacturing a semiconductor device, comprising:
supporting a substrate on a substrate support in a processing chamber, wherein the substrate comprises structures, the substrate support comprises an electrostatic chuck receiving the substrate, and a plurality of temperature sensors are provided on the electrostatic chuck;
conducting an etching process on the substrate in the processing chamber;
generating a laser beam using a heating device;
splitting the laser beam into two or more laser beams using a beam splitter;
heating two or more areas on a surface of the substrate using the two or more laser beams during the etching process;
controlling movement of the beam splitter to direct the two or more laser beams to different portions of the substrate during the etching process;
monitoring temperatures of the two or more areas of the substrate using the plurality of temperature sensors during the etching process;
monitoring at least critical dimensions of the structures during the etching process performed on the substrate in the processing chamber; and
in response to at least the monitoring the temperatures of the two or more areas of the substrate and the critical dimensions of the structures during the etching process, controlling the heating device to control the temperatures of the two more areas on the surface of the substrate during the etching process.

14. The method of claim 13, wherein the processing chamber is a plasma etching apparatus, and the etching process comprises:
- etching a target layer disposed over the substrate; and
- controlling at least the critical dimensions of the structures being fabricated on the substrate using plasma etching.

15. The method of claim 13, wherein the heating the two or more areas comprises heating the two or more areas to up to 200° C.

16. The method of claim 13, wherein the controlling the heating device comprises adjusting an intensity of the laser beam.

17. The method of claim 13, wherein the beam splitter comprises a plate configured to split the laser beam into the two or more laser beams.

18. The method of claim 13, wherein the beam splitter comprises a cube including two glass prisms configured to split the laser beam into the two or more laser beams.

19. The method of claim 13, further comprising monitoring an etch depth during the etching process performed on the substrate in the processing chamber.

20. The method of claim 19, further comprising increasing or decreasing heating supplied by the two or more laser beams based on the monitored etch depth.

* * * * *